United States Patent
Jain et al.

(10) Patent No.: US 11,847,345 B2
(45) Date of Patent: *Dec. 19, 2023

(54) MEMORY CIRCUIT INCLUDING AN ARRAY CONTROL INHIBITOR

(71) Applicant: Taiwan Semiconductor Manufacturing Company Limited, Hsinchu (TW)

(72) Inventors: Sanjeev Kumar Jain, Ottawa (CA); Cormac Michael O'Connell, Ontario (CA)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/851,109

(22) Filed: Jun. 28, 2022

(65) Prior Publication Data

US 2022/0326875 A1 Oct. 13, 2022

Related U.S. Application Data

(63) Continuation of application No. 17/091,002, filed on Nov. 6, 2020, now Pat. No. 11,403,033.

(60) Provisional application No. 62/955,616, filed on Dec. 31, 2019.

(51) Int. Cl.
*G06F 3/06* (2006.01)
*G11C 11/419* (2006.01)
*G11C 11/412* (2006.01)

(52) U.S. Cl.
CPC .......... *G06F 3/0655* (2013.01); *G06F 3/0604* (2013.01); *G06F 3/0679* (2013.01); *G11C 11/419* (2013.01); *G11C 11/412* (2013.01)

(58) Field of Classification Search
CPC .... G06F 3/0655; G06F 3/0604; G06F 3/0679; G11C 11/419; G11C 11/412; G11C 5/148; G11C 2207/2227; G11C 11/418; G11C 8/12; G11C 11/4074; G11C 11/4076; G11C 11/409; G11C 11/4094
USPC ........................................................ 711/154
See application file for complete search history.

(56) References Cited

U.S. PATENT DOCUMENTS

| 11,403,033 B2* | 8/2022 | Jain ................ G11C 11/418 |
| 2019/0221273 A1 | 7/2019 | Parkinson et al. |
| 2020/0117393 A1 | 4/2020 | Boehm et al. |

(Continued)

FOREIGN PATENT DOCUMENTS

| CN | 1181632 A | * | 5/1998 | ......... G11C 11/4074 |
| CN | 105825897 A | * | 8/2016 | ......... G11C 29/4401 |
| CN | 107545917 A | * | 1/2018 | ........... G11C 11/406 |

(Continued)

*Primary Examiner* — Fernando Hidalgo
(74) *Attorney, Agent, or Firm* — Jones Day

(57) ABSTRACT

Systems and method are provided for operating a multi-array memory that includes a left memory array and a right memory array of a memory bank. A command is received at memory input pins. A signal representative of the command is propagated to an array control inhibitor. An array inhibit command is received on one or more other pins of the memory and provided to the array control inhibitor. The array control inhibitor is used to prevent arrival of the command to one of the left memory array and the right memory array based on the array inhibit command.

20 Claims, 13 Drawing Sheets

(56) References Cited

U.S. PATENT DOCUMENTS

2021/0166746 A1    6/2021  Lu et al.

FOREIGN PATENT DOCUMENTS

| JP | 2017010607 A | | 1/2017 | |
|----|---|---|---|---|
| KR | 20080025841 A | * | 3/2008 | |
| WO | WO-2016182783 A1 | * | 11/2016 | ........... G11C 11/419 |

* cited by examiner

MEMORY CIRCUIT INCLUDING AN ARRAY CONTROL INHIBITOR

CROSS-REFERENCE TO RELATED APPLICATIONS

This application is a continuation of U.S. patent application Ser. No. 17/091,002, filed Nov. 6, 2020, entitled "Memory Circuit Including an Array Control Inhibitor," which claims priority to U.S. Provisional Application No. 62/955,616, filed Dec. 31, 2019, entitled "Multi-Array RAM Architecture" which are incorporated herein by reference in their entirety.

BACKGROUND

A memory bank is a logical unit of storage. A memory bank typically includes multiple rows and columns of storage units (memory cells). Control signals are routed to memory banks to initiate operations, such as read and write operations. Operating memory banks has an associated power cost, as does transmission of control signals for operating those memory banks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
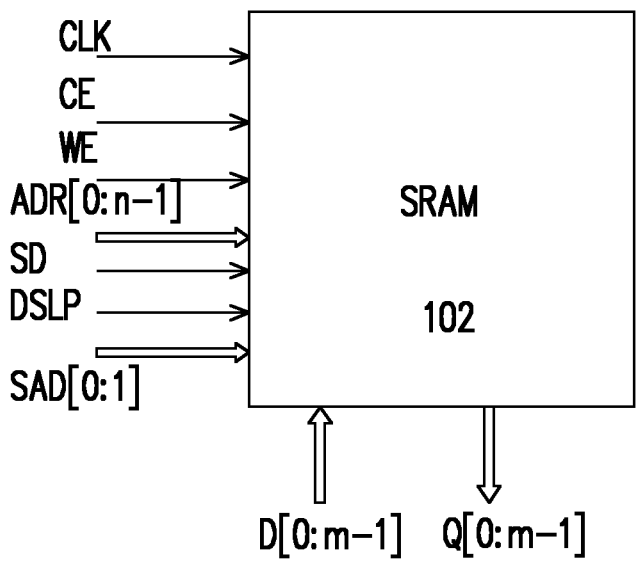
FIG. 1 is a diagram depicting a memory circuit that is configured to receive array inhibit commands in an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Memory devices are typically implemented by activating/transmitting commands (e.g., word line activation commands, column read commands, word line/bit line pre-charge commands, sense amplifier pre-charge commands, sense amplifier enable commands, read driver commands, write driver commands) to memory banks, which are often implemented via multiple memory arrays (e.g., a left array and a right array of a memory bank, three memory arrays of a memory bank). Each memory array contains a plurality of memory cells, typically arranged in rows and columns. In some implementations, commands are transmitted to all arrays of a memory bank, regardless of whether the command is intended a sub-portion of the memory bank (e.g., to one or more memory cells of a particular memory array of the memory bank). The transmission of commands to memory arrays of a memory bank has an associated power cost. There is a dynamic power cost associated with the transmission of individual commands. And there is a static power cost associated with powering components (e.g., logic gates, buffers) that facilitate transmission of the commands.

Systems and methods as described herein can, in embodiments, reduce power costs associated with memories having multi-array memory banks. For example, dynamic power costs may be reduced by inhibiting transmission of commands to memory arrays that are not intended recipients of the command. In examples, static power costs may be reduced by inhibiting power to busses that power control circuitry of memory arrays that are not intended recipients of the command. And in other examples, further power costs can be reduced by inhibiting power to memory arrays that are not intended recipients of the command.

FIG. 1 is a diagram depicting a memory circuit that is configured to receive array inhibit commands in an embodiment. The example SRAM memory 102 includes a plurality of command input pins configured to receive a command (e.g., a command to read data from the memory 102 or to write data to the memory 102). In the example of FIG. 1, the memory 102 is configured to receive a clock input (CLK), a chip enable input (CE), a write enable input (WE), and an address input (ADR[0:n-1]) where an address is provided using n pins. In embodiments, the address received at the address input indicates a memory bank, made up of two or more memory arrays, to which a received command is directed. The memory further includes a pin for receiving a shutdown command (SD) and a pin for receiving a sleep command (DSLP).

The memory of FIG. 1 also includes array inhibiting pins (SAD[0:1]) configured to receive an inhibit command to block command signals to one of a left memory array or a right memory array, such as left and right memory arrays of a single memory bank identified by the address input (ADR). The array inhibiting pins facilitate blocking of command signals using one of a variety of mechanisms, including blocking propagation of a command along a command path as well as inhibiting power to a control power bus via which the command is to be propagated to the inhibited array. In the example of FIG. 1, a low (0) signal on SAD[0] inhibits the transmission of control signals to the left array, a low (0) signal on SAD[1] inhibits the transmission of control signals to the right array, and a low (0) signal on both SAD[0] and SAD[1] inhibits transmission of control signals to both arrays.

Figure 2:
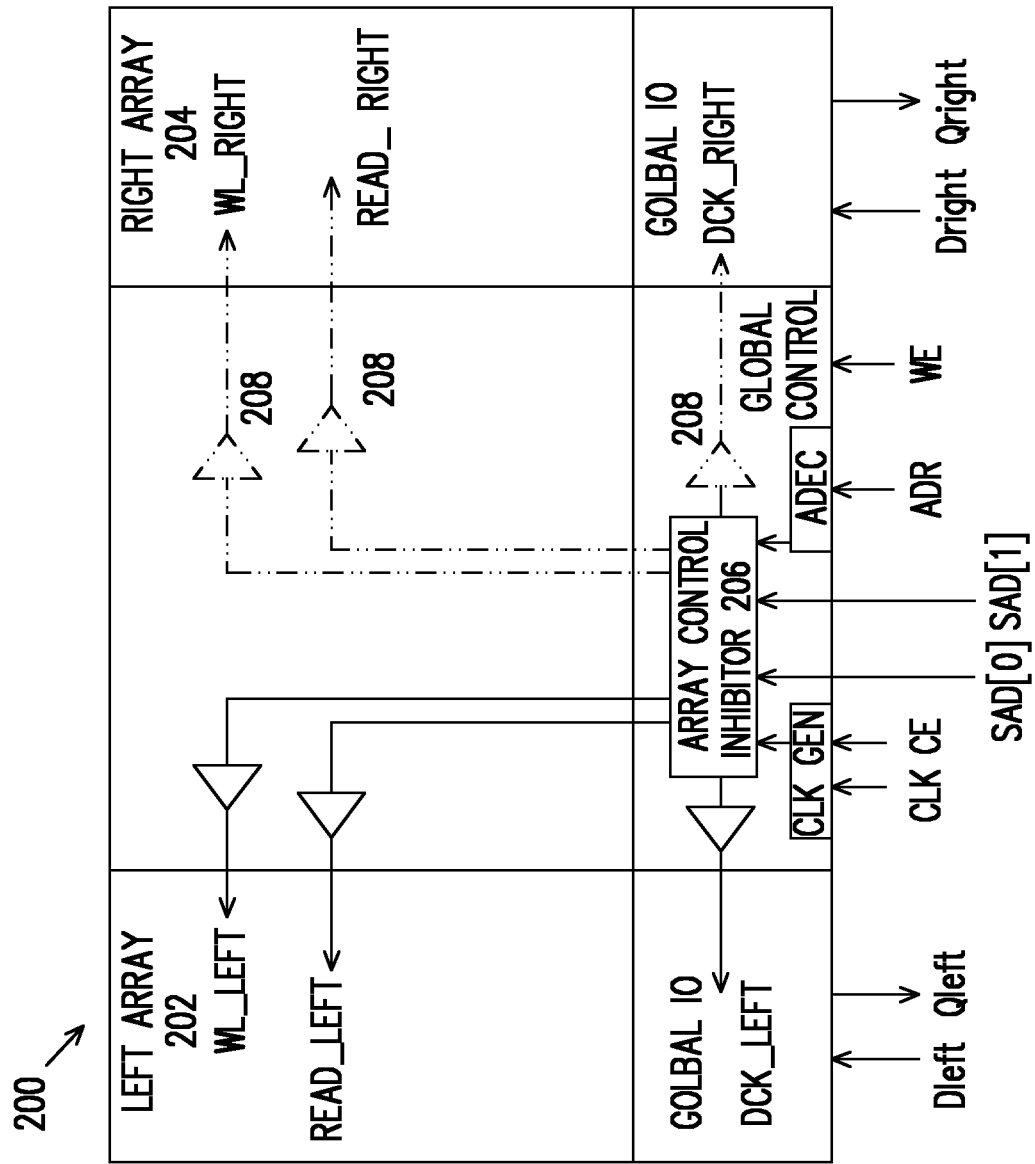
FIG. 2 is a block diagram depicting a memory architecture that includes an array control inhibitor in accordance with an embodiment.

FIG. 2 is a block diagram depicting a memory architecture that includes an array control inhibitor in accordance with an embodiment. An SRAM memory circuit includes a left memory array 202 of a memory bank that includes a plurality of left memory cells and a right memory array 204 of the memory bank that includes a plurality of right memory cells. The memory 200 includes data input pins (Dleft, Dright) for receiving data to be written to respective memory arrays 202, 204 and data output pins (Qleft, Qright) for outputting data read from respective memory arrays 202, 204. The memory 200 further includes a plurality of command input pins (CLK, CE, ADR, WE) configured to receive a command. The memory 200 further includes two array inhibiting pins SAD[0], SAD[1] that are configured to receive an inhibit command to block command signals to one of the left memory array 202 and the right memory array 204.

An array control inhibitor 206 is configured to receive the inhibit command from SAD[0], SAD[1] and to prevent arrival of the command to one of the left memory array 202 and the right memory array 204 based on the inhibit command. In the example of FIG. 2, signals on the array inhibiting pins SAD[0], SAD[1] indicate that command signals to the right array 204 should be inhibited (e.g., via a low (0) signal on SAD[1]), where the array control inhibitor's preventing arrival of the commands (e.g., a word line activation command (WL_Right), a read command (Read_Right), a data clock signal (DCK_Right)) is illustrated by dashed lines along the control signal paths and corresponding buffer gates 208 for propagating a signal representative of a received command. While the right array 204 is inhibited in the example of FIG. 2, the left array 202 is not. Accordingly command signals (e.g., a word line activation command (WL_Left), a read command (Read_Left), a data clock signal (DCK_Left)) are permitted to arrive at their respective destination (e.g., as instructed by commands received on the command input pins (e.g., CLK, CE, ADR, WE)).

In another example where signals on the array inhibiting pins SAD[0], SAD[1] indicate that command signals to the left array 204 should be inhibited (e.g., via a low (0) signal on SAD[0]), the array control inhibitor would prevent arrival of commands to the left array 202. In that example where the left array 202 is inhibited, the right array 204 is not. Accordingly command signals (e.g., a word line activation command (WL_Right), a read command (Read_Right), a data clock signal (DCK_Right)) are permitted to arrive at their respective destination (e.g., as instructed by commands received on the command input pins (e.g., CLK, CE, ADR, WE)).

Figure 3:
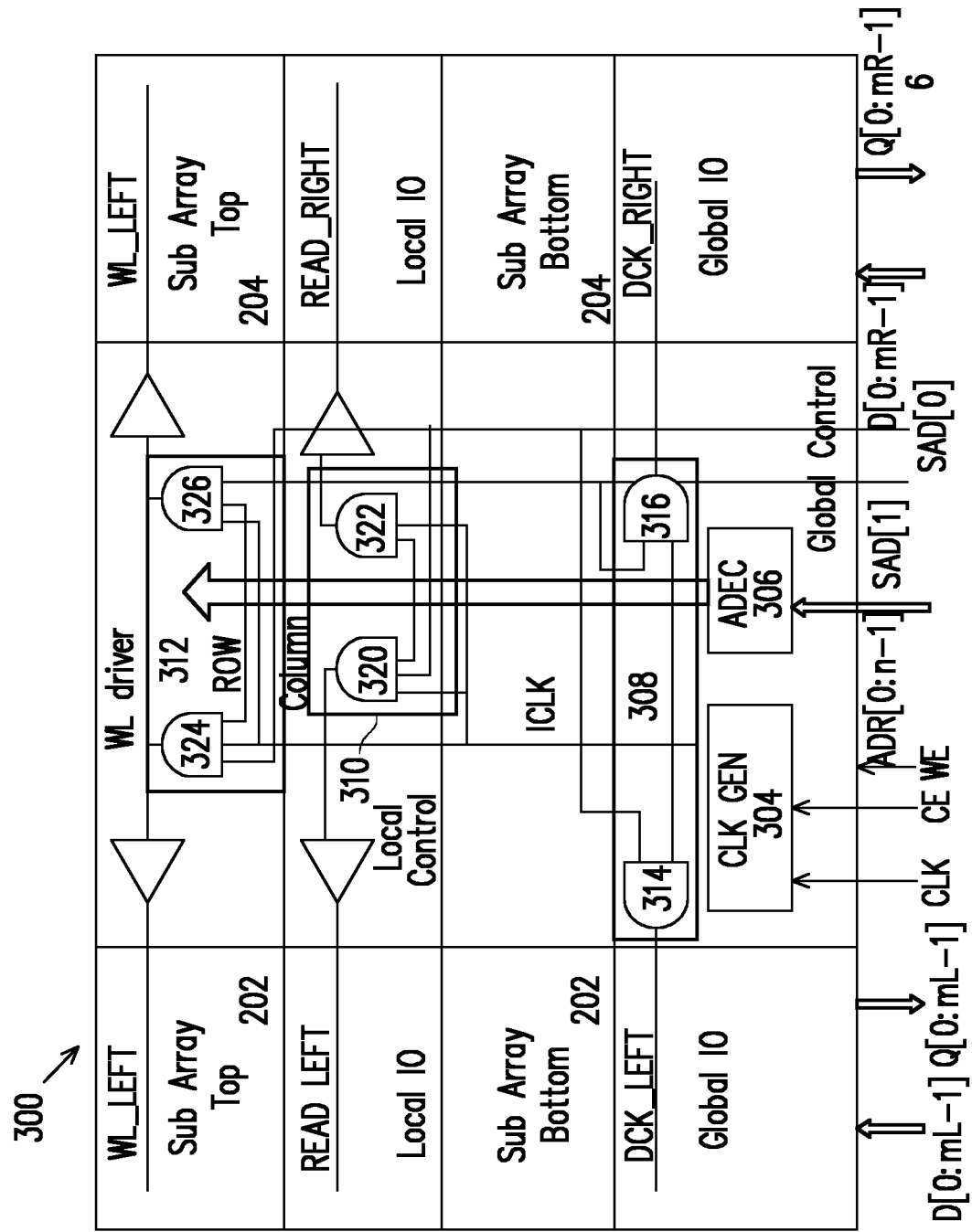
FIG. 3 is a diagram of a memory that depicts array inhibiting sub-circuits of an array control inhibitor in accordance with embodiments.

FIG. 3 is a diagram of a memory that depicts array inhibiting sub-circuits of an array control inhibitor in accordance with embodiments. The memory 300 includes a memory bank that is divided into a left memory array 202 (divided into a top sub-array and a bottom sub-array) and a right memory array 204 (also divided into a top sub-array and a bottom sub-array). The memory is configured to receive commands via command input pins, such as CLK, CE, WE ADR[0:n-1], to read data from the memory arrays on data output pins Q, and write data into the memory arrays on data input pins D. A clock generation circuit 304 is configured to distribute an internal clock ICLK to control circuitry (e.g., circuitry for generating WL and Read signals) and to distribute a data clock to input/output circuitry (e.g., DCK). An address decoder (ADEC) 306 is configured to determine to which rows and/or column of a memory bank a received command is intended and to activate appropriate control signals for that row/column of the memory bank.

The memory 302 of FIG. 3 further includes array control inhibitor circuitry for preventing arrival of the command to one of the left memory array 202 and the right memory array 204 based on an inhibit command received on array inhibiting pins SAD[0], SAD[1]. In FIG. 3, the array control inhibitor includes three components, a first array control inhibitor component 308, comprising AND gates 314, 316, for inhibiting a DCK-based signal, a second array control inhibitor component 310 for inhibiting a Read-based signal, and a third array control inhibitor component 312 for inhibiting a WL-based signal. As noted above, a low (0) signal on array inhibiting pin SAD[0] instructs the memory 300 to prevent arrival of commands to the left array 202, and a low (0) signal on array inhibiting pin SAD[1] instructs the memory 300 to prevent arrival of commands to the right array 204.

Specifically, the first array control inhibitor component 308 includes a left array sub-circuit 314 in the form of an AND gate that is configured to receive a signal representative of an associated command (e.g., the ICLK signal for generating the DCK_Left signal) and a signal indicating whether the array inhibiting inputs (e.g., SAD[0]) identify a left memory array operation. When SAD[0] is low, indicating that the present command is not for a left memory array operation, left array sub-circuit 314 prevents the DCK_Left signal from propagating. The first array control inhibitor component 308 also includes a right array sub-circuit 316 in the form of an AND gate that is configured to receive a signal representative of an associated command (e.g., the ICLK signal for generating the DCK_Right signal) and a signal indicating whether the array inhibiting inputs (e.g., SAD[1]) identify a right memory array operation. When SAD[1] is low, indicating that the present command is not for a right memory array operation, right array sub-circuit 316 prevents the DCK_Right signal from propagating.

The second 310 and third 312 array control inhibitor components include similar sub-circuits. Specifically, the second array control inhibitor component 310 includes a left array sub-circuit 320 that receives a signal from the address decoder 306 indicating a column associated with a read operation, the ICLK signal, and the SAD[0] signal. When SAD[0] is low (0), the left array sub-circuit and gate 320 prevents arrival of the Read_Left signal at the Local IO of the left memory array 202. Similarly, the second array control inhibitor component 310 includes a right array sub-circuit 322 that receives the signal from the address decoder 306 indicating a column associated with a read operation, the ICLK signal, and the SAD[1] signal. When SAD[1] is low (0), the right array sub-circuit and gate 322 prevents arrival of the Read_Right signal at the Local TO of the right memory array 204. The third array control inhibitor component 312 provides similar control signal propagation prevention for WL signals. There a left array sub-circuit 324 receives a row indication from ADEC 306, the ICLK signal, and SAD[0], preventing arrival of the WL signal to the left memory array 202 when SAD[0] indicates the received command is not a left memory array operation. And a right array sub-circuit 326 prevents arrival of the WL signal to the right memory array 204 when SAD[1] is low, indicating the current command is not a right memory array operation.

Figure 4:
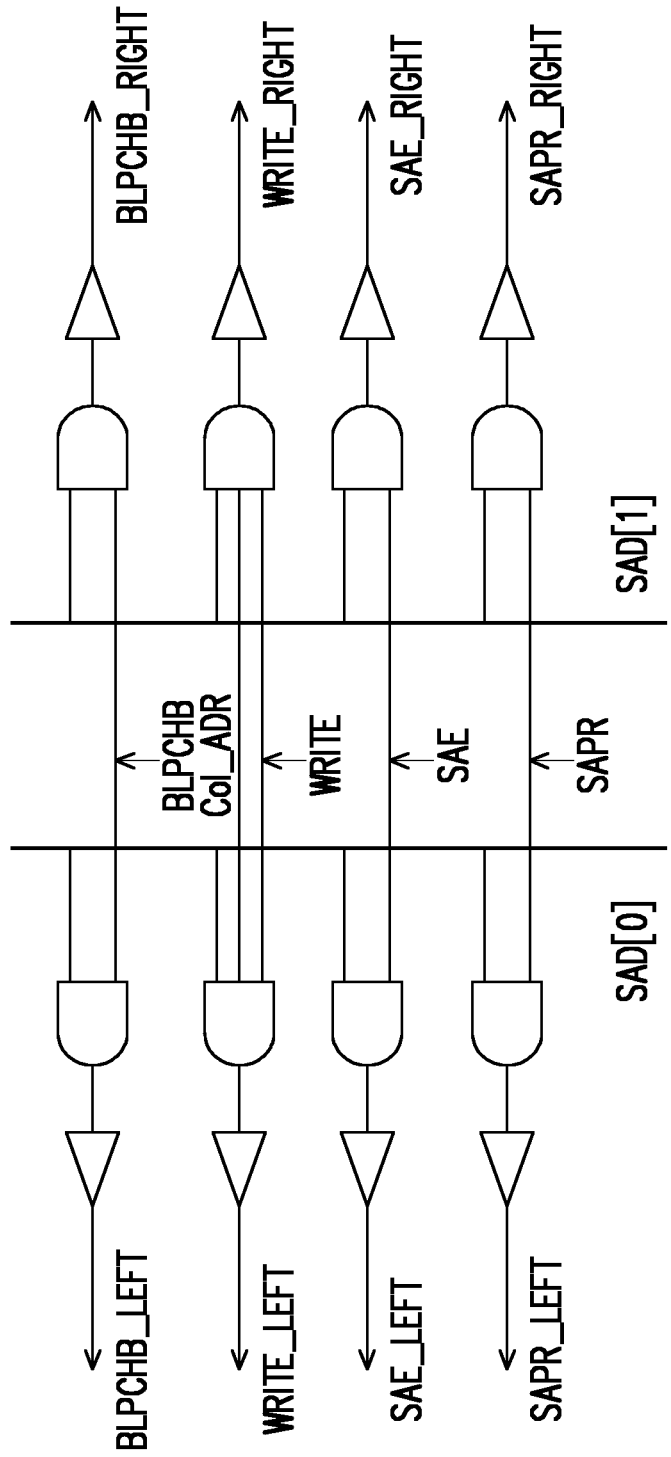
FIG. 4 illustrates array control inhibitor components configured to prevent arrival of additional commands in accordance with embodiments.

Array control inhibitor components may be implemented to prevent arrival of other commands as well at one or both arrays of a memory bank. FIG. 4 illustrates array control inhibitor components configured to prevent arrival of additional commands in accordance with embodiments. A first inhibit command SAD[0] is configured to prevent arrival of commands to the left array when its value is low (0). Specifically, a sense amplifier pre-charge signal (SAPR_Left) is prevented from arrival despite an active SAPR signal transmitted to the memory bank by a low SAD[0] signal. Similarly, a sense amplifier enable signal (SAE_Left), a Write signal (Write_Left), and a bit line pre-charge signal (BLPCHB_Left) are prevented from arriving at the left sub-array when the SAD[0] indicates that a current operation is not a left memory array operation. Similarly, a low SAD[1] signal provides an inhibit command that, when low, prevents arrival of command signals including SAPR_Right, SAE_Right, Write_Right, and BLPCHB_Right to the right array of the memory bank.

In addition to limiting dynamic power consumption by preventing propagation of control signals, an array control inhibitor can also limit static power consumption by powering down certain components of a memory based on inhibit commands (e.g., commands on SAD[0], SAD[1]). For example, with reference back to FIG. 2, command signal transmission paths may include buffer gates 208 that are configured to receive and propagate command signals. Those buffer gates 208 consume some power at all times that they are active. Those buffer gates 208 (or other logic gates or circuit components along command signal transmission paths) can be selectively deactivated to limit power consumption, such as by inhibiting (turning off power to) a power bus that provides power to the buffer gates 208.

Figure 5:
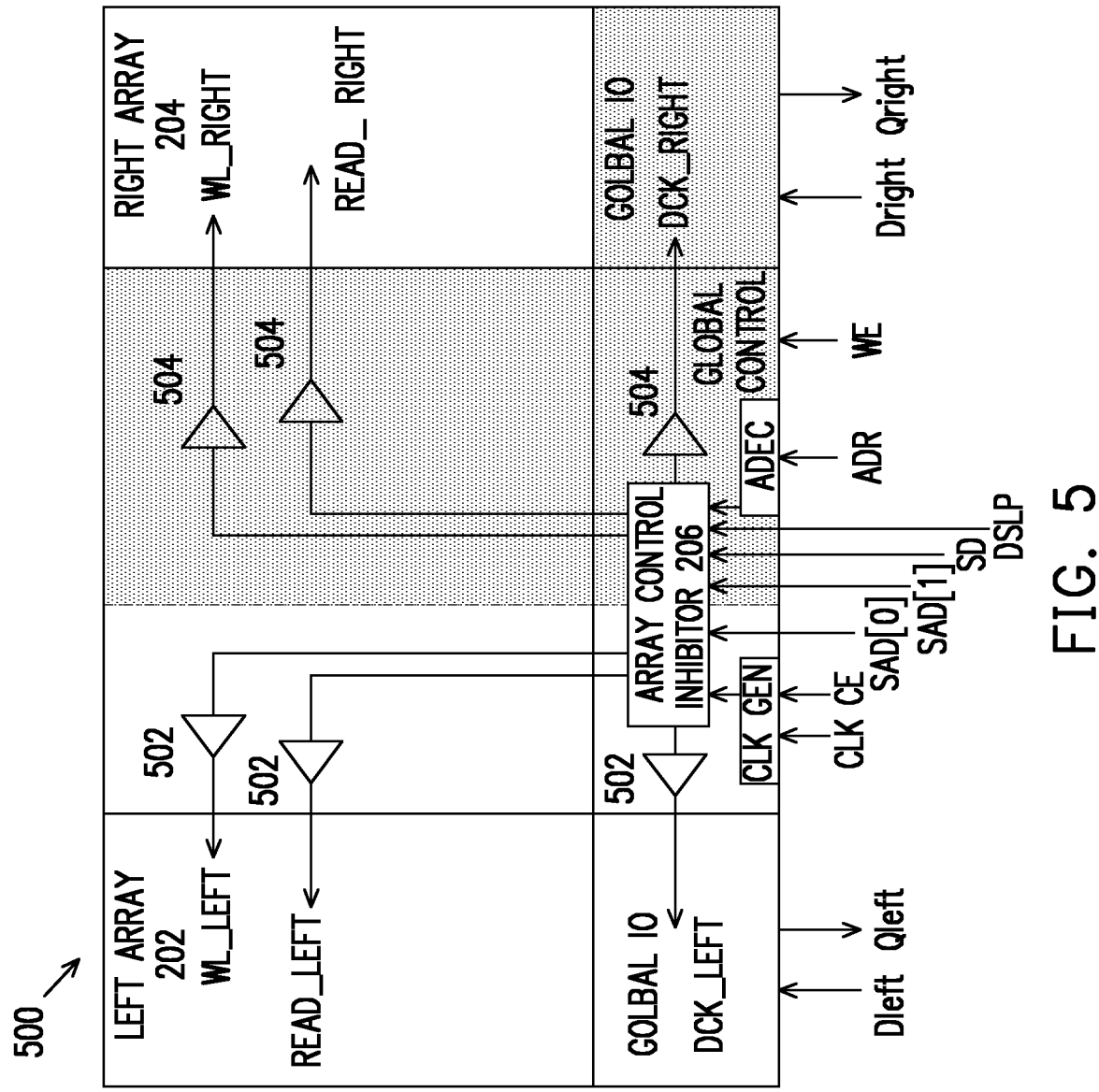
FIG. 5 is a diagram depicting a memory configured for inhibiting of power busses of circuitry for propagating command signals in response to a left array operation mode command in embodiments.

FIG. 5 is a diagram depicting a memory configured for inhibiting of power busses of circuitry for propagating command signals in response to a left array operation mode command in accordance with embodiments. The memory of FIG. 5 includes first control circuitry 502 (e.g., buffer gates) powered by a first control power bus configured to operate the left memory array 202 and second control circuitry 504 powered by a second control power bus configured to operate the right memory array 204. The array control inhibitor 206 is configured to receive memory state control signals (e.g., left array operation signal SAD[0], right array operation signal SAD[1], sleep signal DSLP, and shutdown signal SD) The array control inhibitor circuit 206 is configured to inhibit power busses according to a mode identified by the memory state control signals.

In the example of FIG. 5, the memory state control signals indicate a left array operation mode (e.g., a high (1) value on SAD[0] and a low (0) value on SAD[1]). Accordingly, the array control inhibitor 206 inhibits the second control power bus to the second control circuitry 504, powering down the second control circuitry 504 during the operation that is not intended for the right memory array 504.

Conversely, when the memory state control signals indicate a right array operation mode (e.g., a high (1) value on SAD[1] and a low (0) value on SAD[0]), the array control inhibitor 206 inhibits the first control power bus to the first control circuitry 502, powering down the first control circuitry 502 during the operation that is not intended for the left memory array 502.

Figure 6:
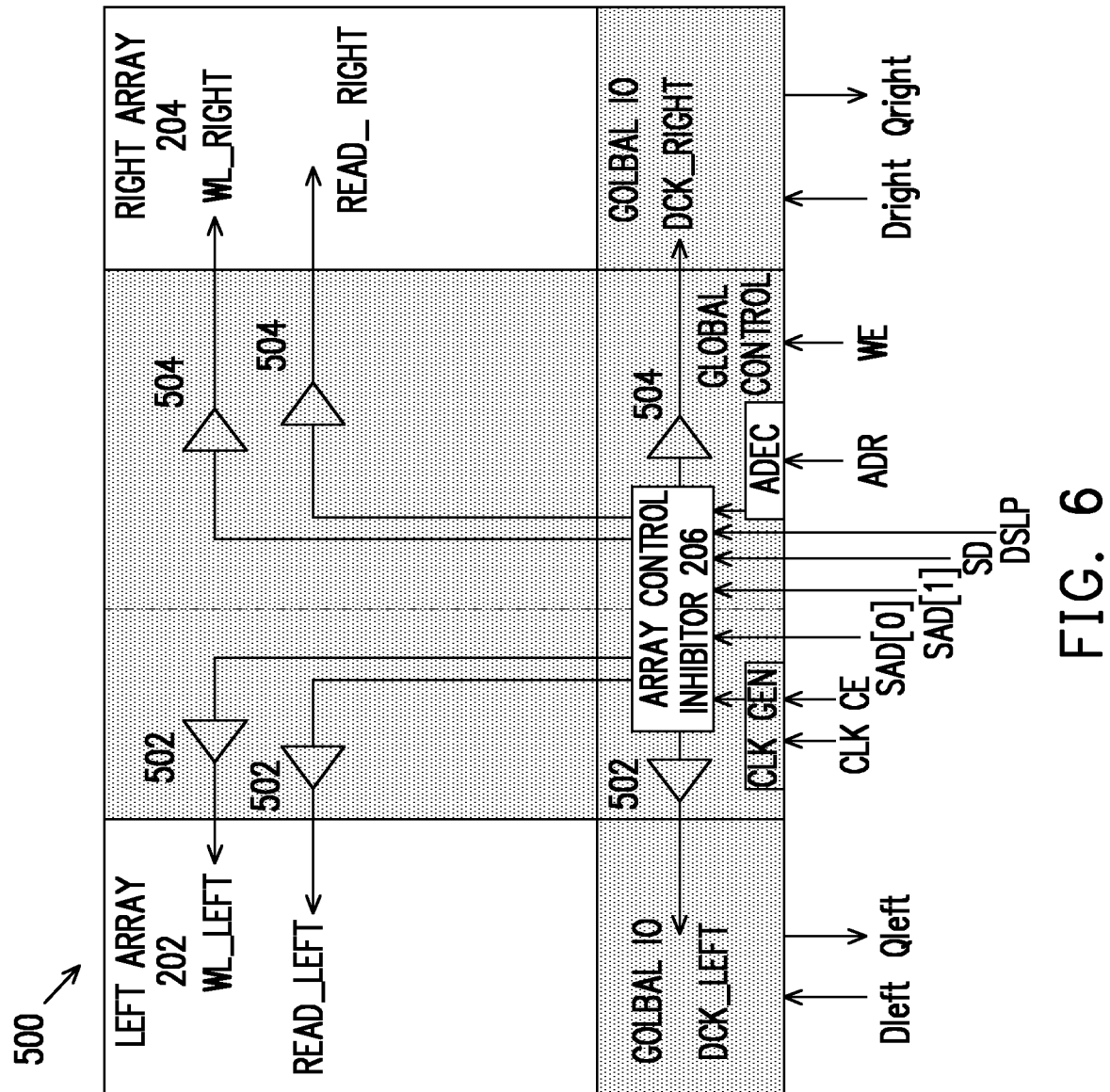
FIG. 6 is a diagram depicting a memory configured for inhibiting of power busses of circuitry for propagating command signals in response to a sleep signal in embodiments.

In some embodiments, the memory 500 and array control inhibitor 206 are configured to receive additional memory state control signals. FIG. 6 is a diagram depicting a memory configured for inhibiting of power busses of circuitry for propagating command signals in response to a sleep signal in accordance with embodiments. Upon receipt of a sleep signal (e.g., on DSLP pin), the array control inhibitor 206 is configured to inhibit power buses according to the sleep mode protocol. Specifically, the array control inhibitor 206 inhibits the first control power bus that powers the first control circuitry 502. The array control inhibitor 206 is also configured to inhibit the second control power bus that powers the second control circuitry 504. Thus in the sleep mode, power to all of the control circuitry 502, 504, in embodiments, is inhibited.

Figure 7:
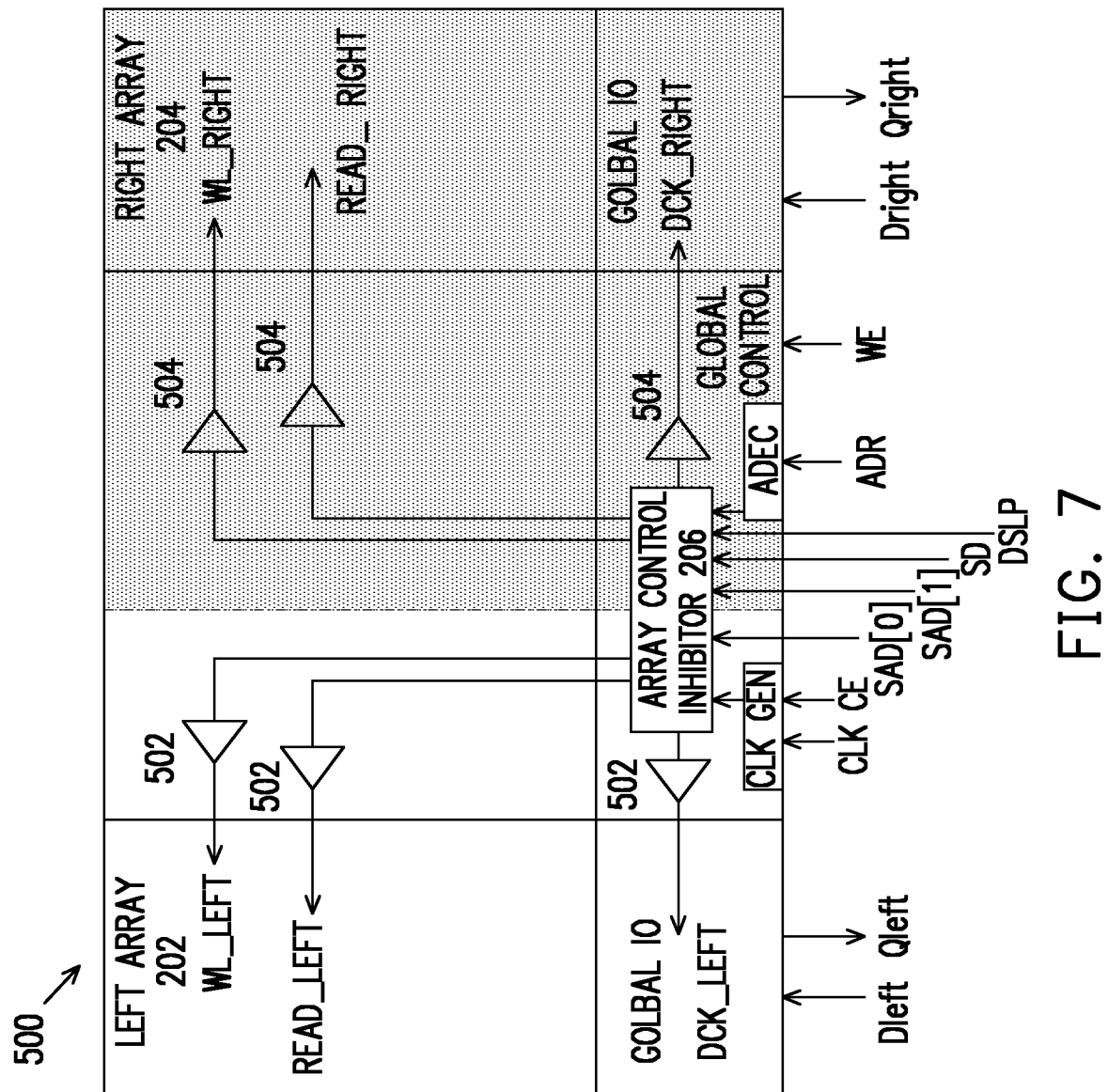
FIG. 7 is a diagram depicting an array control inhibitor selectively inhibiting an array power bus and a control power bus in accordance with embodiments.

In certain memories, power is supplied to memory arrays 202, 204 when the memory is active, providing another source of static power consumption. When in a shutdown mode (see, e.g., FIG. 8), power to all control circuitry and all memory arrays is inhibited. In embodiments, an array control inhibitor 206, is configured to selectively inhibit power to individual memory arrays. FIG. 7 is a diagram depicting an array control inhibitor selectively inhibiting an array power bus and a control power bus in accordance with embodiments. Similar to the example of FIG. 5, memory state control signals (e.g., a high (1) value on SAD[0] and a low (0) value on SAD[1]) indicate a left array operation. Like in the example of FIG. 5, the array control inhibitor is configured to inhibit the second control power bus that powers the second control circuitry 504 that operates the right memory array 204. The first control power bus that powers the first control circuitry 502 that operates the left memory array 202 is active. Additionally in the example of FIG. 7, the array control inhibitor 206 is configured to inhibit a right array power bus that powers the right memory array 204.

Conversely when a right memory array operation is indicated by the memory state control signals (e.g., a high (1) value on SAD[1] and a low (0) value on SAD[0]), the array control inhibitor is configured to inhibit the first control power bus that powers the first control circuitry 502 that operates the left memory array 202. The second control power bus that powers the second control circuitry 504 that operates the right memory array 204 is active. Additionally in that case, the array control inhibitor 206 is configured to inhibit a left array power bus that powers the left memory array 202.

Figure 8:
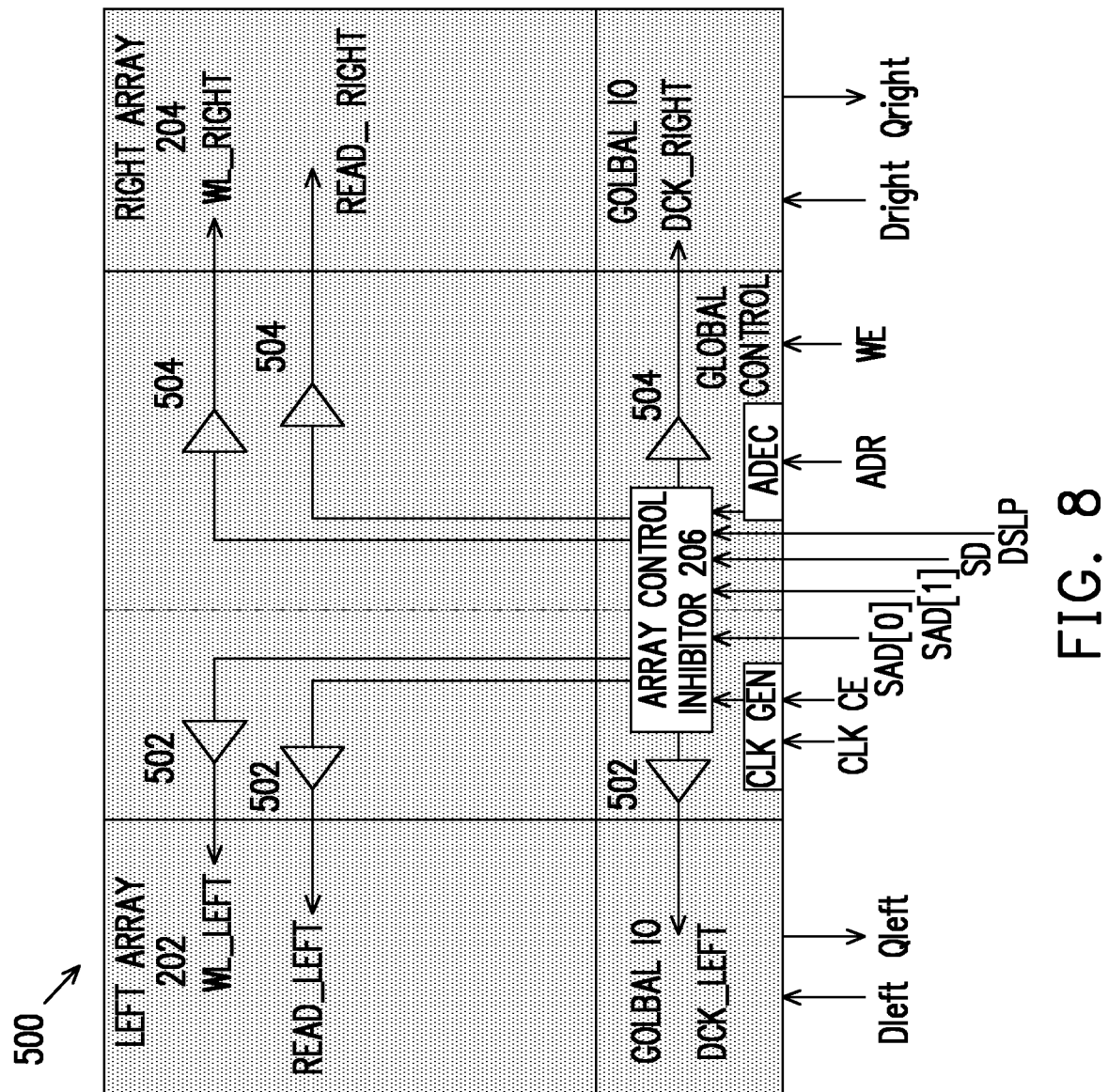
FIG. 8 is a diagram depicting an array control inhibitor inhibiting array power buses and control power buses in a shutdown mode in accordance with embodiments.

As noted above, in a shutdown mode, power to all control circuitry and all memory arrays is inhibited. FIG. 8 is a diagram depicting an array control inhibitor inhibiting array power buses and control power buses in a shutdown mode in accordance with embodiments. Specifically, upon receipt of memory state control signals indicating a shutdown mode (e.g., via the SD signal or low values (0) on both SAD[0] and SAD[1]), the array control inhibitor 206 is configured to inhibit: the left array power bus that powers the left memory array 202, the right array power bus that powers the right memory array 204, the first control power bus that powers the first control circuitry 502 configured to operate the left memory array 202, and the second control power bus that powers the second control circuitry 504 configured to operate the right memory array.

Figure 9:
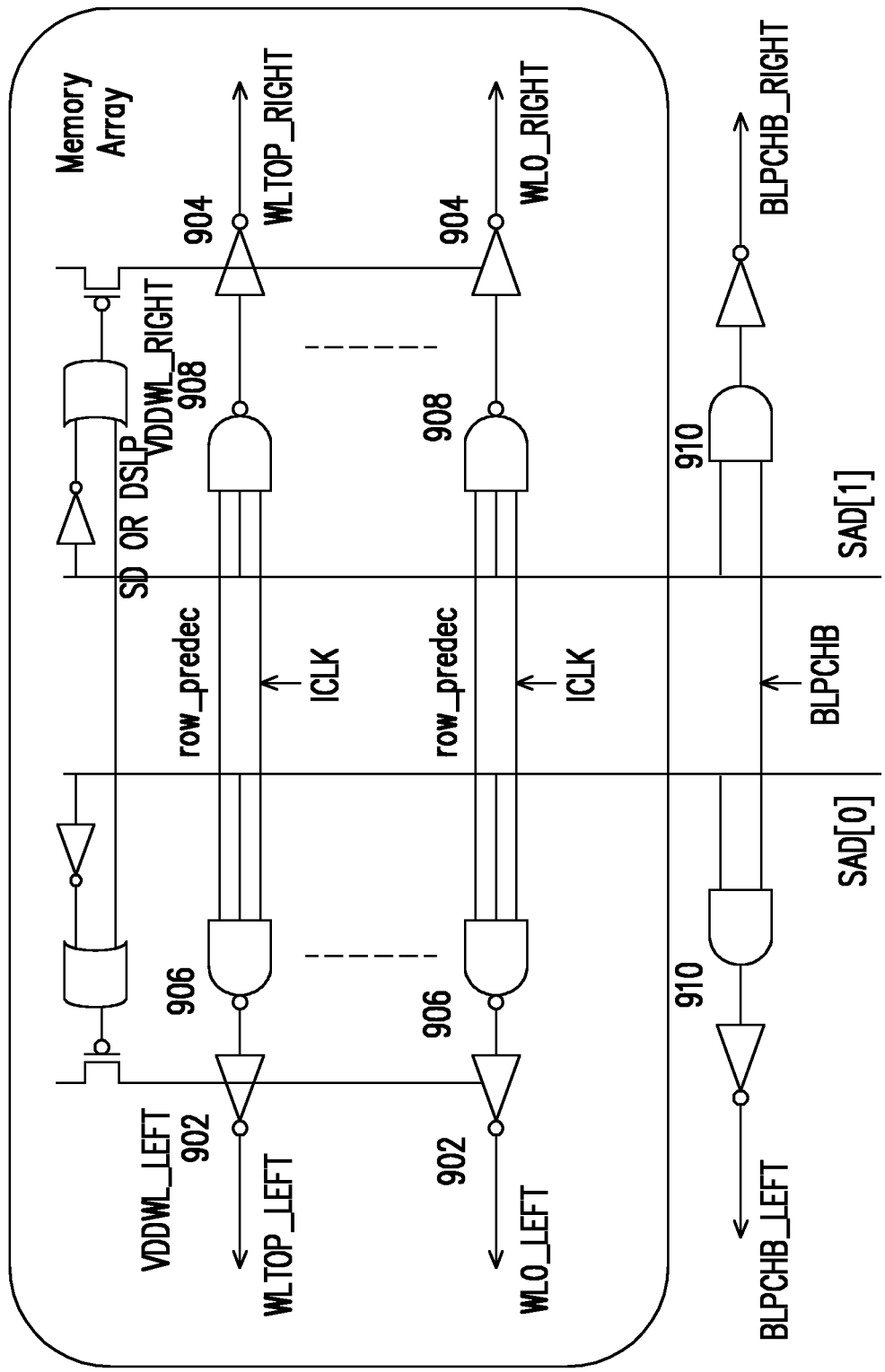
FIG. 9 is a diagram depicting example control inhibitor circuitry in accordance with an embodiment.

Array control inhibitor circuitry for preventing arrival of command signals and to inhibit power buses controlling control circuitry and memory circuitry can take a variety of forms. FIG. 9 is a diagram depicting example control inhibitor circuitry in accordance with an embodiment. FIG. 9 includes a plurality of inverter buffer gates 902, 904 that propagate respective command signals particular memory arrays. Inverters 902 forward signals WLTop_Left and WLO_Left to the left array, while inverters 904 forward signals WLTop_Right and WLO_Right to the right array. Those inverters 902, 904 are powered by respective control power busses. Specifically, inverters 902 are powered by the VDDWL_Left control power bus and inverters 904 are powered by the VDDWL_Right control power bus. Those control power buses may be disabled by the control inhibitor circuitry based on memory state control signals that include a sleep signal (DSLP), a shutdown signal (SD), and SAD[0], SAD[1] that indicate left/right array operation modes.

Specifically, the first control power bus (VDDWL_Left) is inhibited by a low signal at its PMOS transistor when SD (a shutdown mode) or DSLP (a sleep mode) are high or when SAD[0] is low (a right array operation mode). The second control power bus (VDDWL_Right) is inhibited by a low signal at its PMOS transistor when SD or DSLP are high or when SAD[1] is low (a left array operation mode).

Additionally, NAND gates 906, 908 prevent propagation of command signals to the respective inverter buffers 902, 904. Specifically, a low signal on SAD[0] produces a high signal at the output of NAND gates 906, guaranteeing a low signal from inverter buffers 902 and halting of any WL signals to the left array. Similarly, a low signal on SAD[1] produces a high signal at the output of NAND gates 908, guaranteeing a low signal from inverter buffers 904 and halting of any WL signals to the right array. And gates 910 provide similar command signal blocking to the bit line pre-charge bar lines (BLPCHB_Left, BLPCHB_Right), where low signals on SAD[0], SAD[1] guarantee high signals on those active low control lines via their respective inverter buffers.

Figure 10:
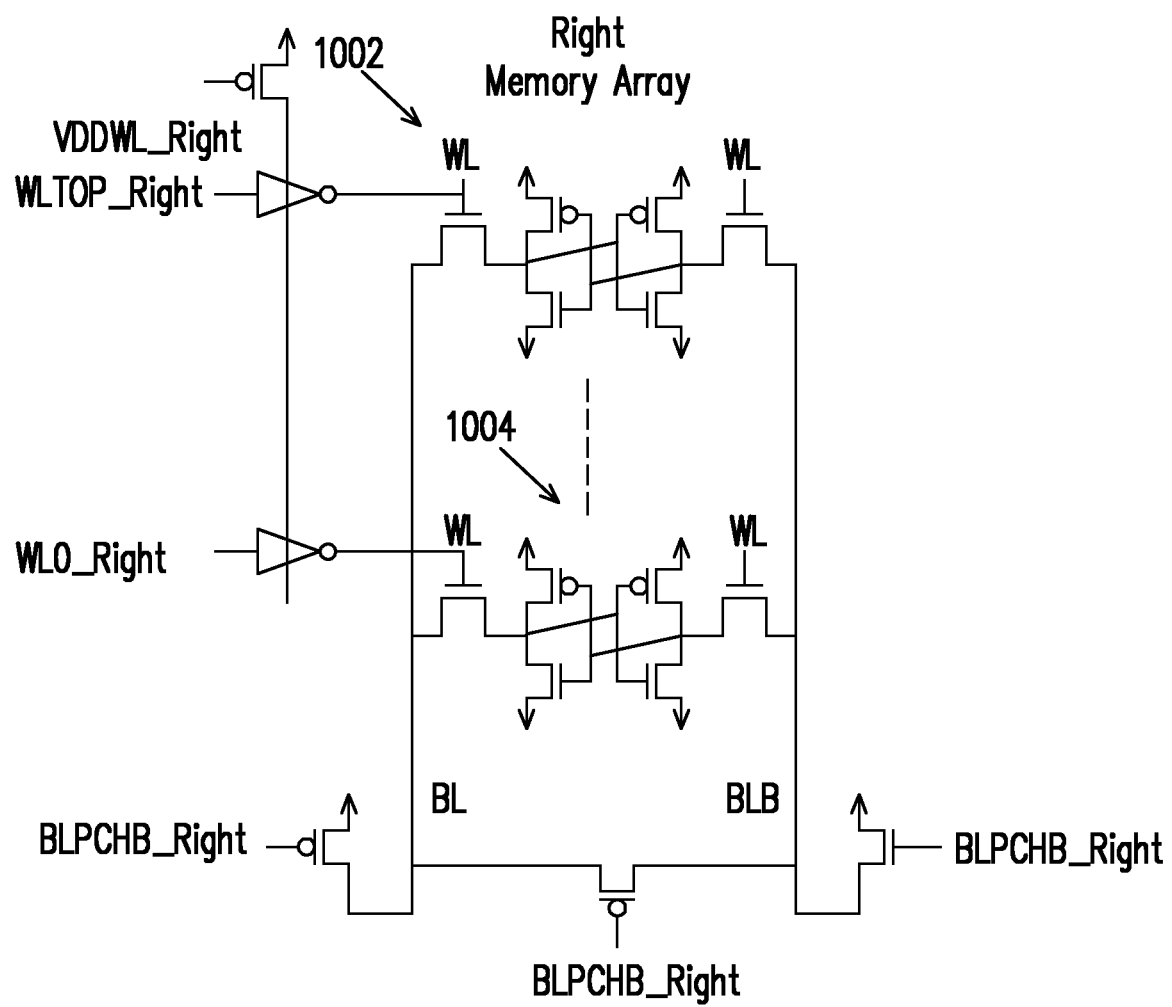
FIG. 10 is a diagram illustrating memory array connectivity of certain of the FIG. 9 control signals to the right memory array in accordance with embodiments.

FIG. 10 is a diagram illustrating memory array connectivity of certain of the FIG. 9 control signals to the right memory array in accordance with embodiments. Disabling of the second control power bus VDDWL_Right prevents any high signal levels from reaching the word line activation transistors of memory cells 1002, 1004, disabling activation of those cells. Specifically, active high signal WLTOP_Right cannot reach cell 1002, and WLO_Right cannot reach cell 1004. Similarly, the high level BLPCHB_Right signals provided when SAD[1] is low inhibits pre-charging of the BL/BLB signals by turning off the three depicted PMOS transistors connected thereto.

Figure 11:
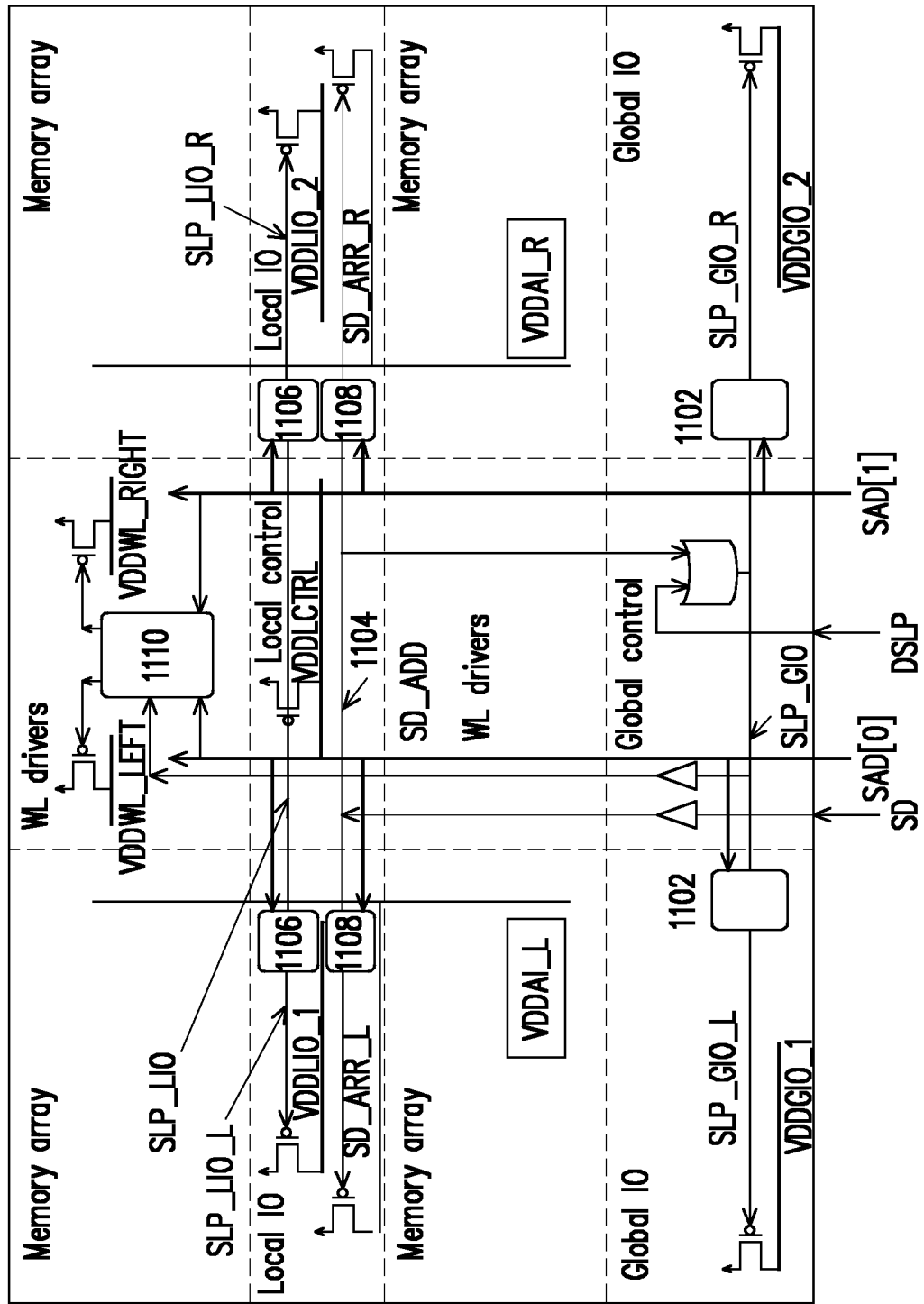
FIG. 11 is a diagram depicting array control inhibitor components for inhibiting memory and control power busses, in accordance with embodiments.
Figure 12:
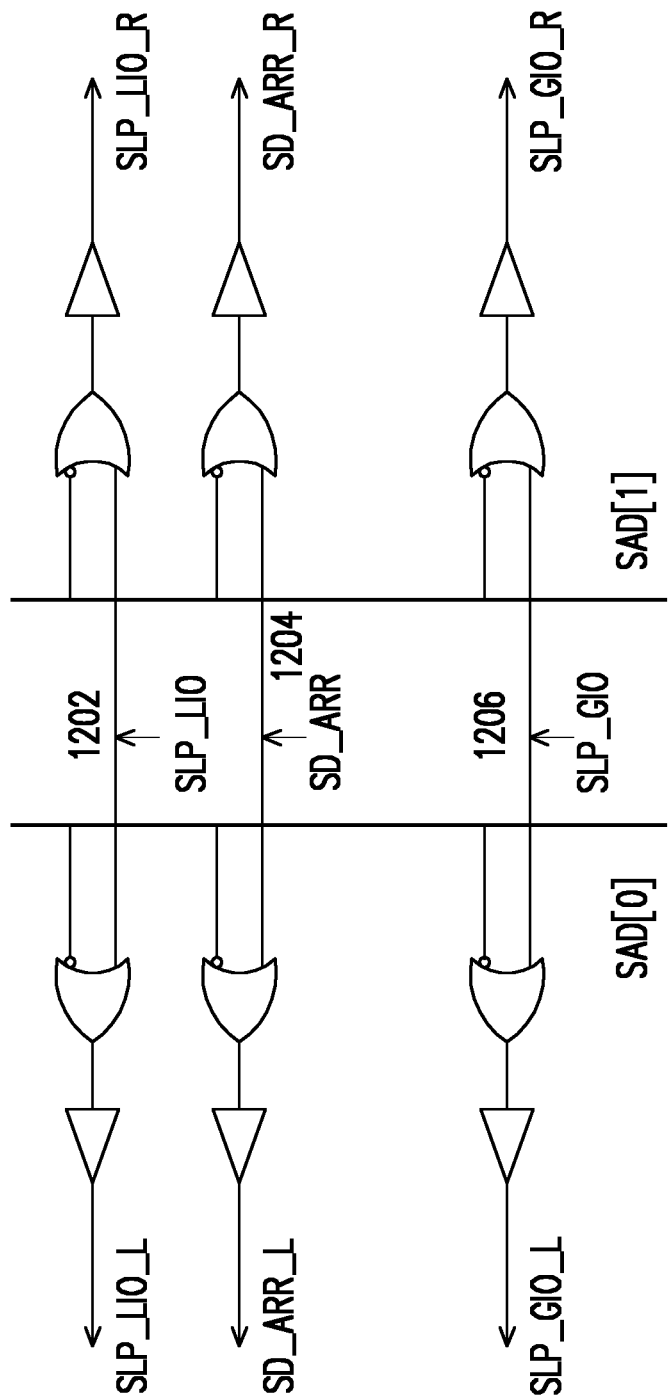
FIG. 12 depicts further detail of certain signals generated by an array control inhibitor in accordance with embodiments.

As noted above, power buses to left and right memory arrays as well as individual control buses can be inhibited based on memory state control signals, such as SD, DSLP, SAD[0], and SAD[1]. FIG. 11 is a diagram depicting array control inhibitor components for inhibiting memory and control power busses, in accordance with embodiments. Regarding global IO control circuitry, left array global IO circuitry is powered by VDDGIO_1 and right array global IO circuitry is powered by VDDGIO_2. Those control buses are inhibited via high level signals on SLP_GIO_L and SLP_GIO_R, respectively. The generation of SLP_GIO_L and SLP_GIO_R at 1102 is based on the SLP_GIO signal (high when either of SD and DSLP are high) and the SAD[0], SAD[1] signals as depicted in FIG. 12. FIG. 12 depicts further detail of certain signals generated by an array control inhibitor in accordance with embodiments. With regard to SLP_GIO_L and SLP_GIO_R, those signals are high, disabling corresponding VDDGIO_1 and VDDGIO_2 at 1206 when sleep or shutdown mode, and therefore SLP_GIO is high, or when a corresponding SAD signal (i.e., SAD[0] for the left array, SAD[1] for the right array) is low.

With reference back to FIG. 11, local control at block 1104 is powered by VDDLCTRL. VDDLCTRL is controlled by SLP_LIO. Similar to the generation of SLP_GIO, the SLP_LIO signal is generated so as to inactivate the VDDLCTRL when either of DSLP and SD are high. Local IO control circuitry is controlled at 1106 in similar manner as the global IO circuitry. Those control buses, VDDLIO_1 for the left local IO circuitry and VDDLIO_2 for the right local IO circuitry, are inhibited via high level signals on SLP_LIO_L and SLP_LIO_R, respectively. The generation of SLP_LIO_L and SLP_LIO_R is illustrated in FIG. 12. The SLP_LIO_L and SLP_LIO_R signals are generated based on the SLP_LIO signal, described above, and SAD[0], SAD[1], respectively as illustrated at 1202. With regard to SLP_LIO_L and SLP_LIO_R, those signals are high when the device is sleep or shutdown mode (i.e., when SLP_LIO is high) or when a corresponding SAD signal (i.e., SAD[0] for the left array, SAD[1] for the right array) is low. With reference back to FIG. 11, high signals at SLP_LIO_L or SLP_LIO_R disables corresponding VDDLIO_1 and VDDLIO_2 control buses for the local control circuitry.

In addition, power to the memory arrays themselves can be inhibited through control of memory array power buses VDDAI_L and VDDAI_R at 1108. Those buses are powered down in shutdown mode (i.e., when SD is high) but in the example of FIG. 11, they are not shutdown based on sleep mode being active (i.e., when DSLP is high). In the example of FIG. 11, the left memory array power bus (VDDAI_L) and the right memory array power bus (VDDAI_R) are inhibited when the array inhibiting pins indicate their respective array is not a target of the current command (e.g., VDDAI_L is powered down when SAD[0] indicates that the current command is not a left memory array operation). Specifically, with reference to FIG. 12 at 1204, both memory array power buses are inhibited when SD_ARR is high, based on a high SD signal. Further, the left memory array power bus is inhibited via a high SD_ARR_L when SAD[0] is low, and the right memory array power bus is inhibited via a high SDD_ARR_R signal when SAD[1] is low.

Control buses (VDDWL_Left, VDDWL_Right) for word line command signals can be powered or inhibited based on SD, SLP, SAD[0] and SAD[1] at 1110 as described above with reference to FIG. 9.

Figure 13:
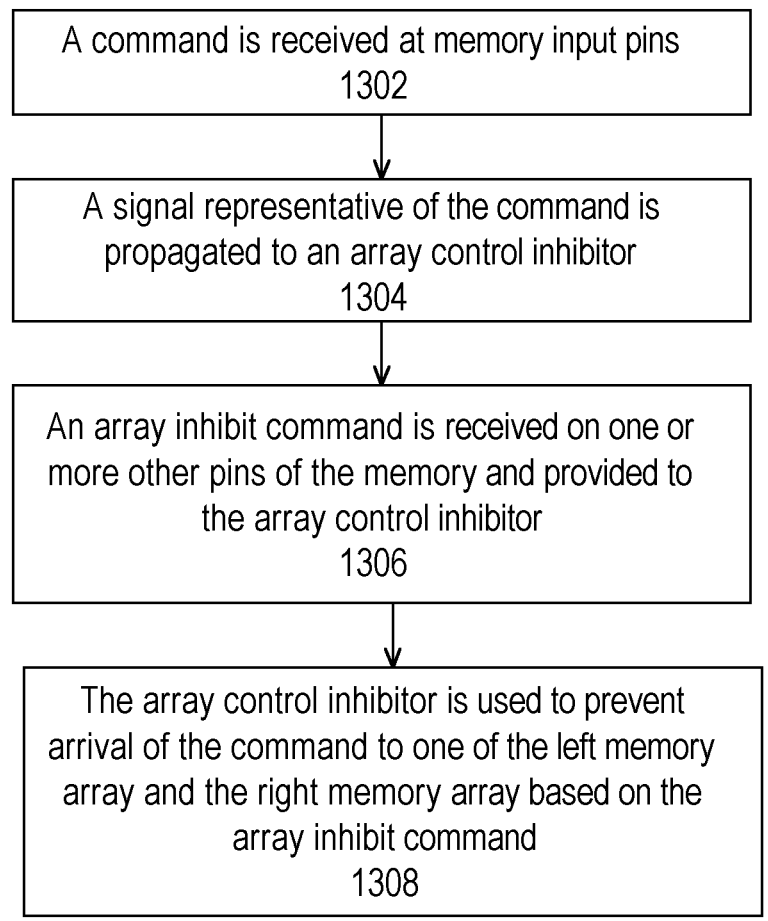
FIG. 13 is a flow diagram depicting a method for operating a multi-array memory that includes a left memory array and a right memory array of a memory bank in an embodiment.

FIG. 13 is a flow diagram depicting a method for operating a multi-array memory that includes a left memory array and a right memory array of a memory bank in an embodiment. The steps of FIG. 13 are provided with reference to previously described structures for ease of understanding, but it is understood that the steps could be performed using a variety of structures. A command is received at memory input pins (e.g., CLK, CE, ADR, WE) at 1302. A signal representative of the command is propagated at 1304 to an array control inhibitor 206. An array inhibit command is received on one or more other pins (e.g., SAD[0], SAD[1]) of the memory and provided to the array control inhibitor 206 at 1306. The array control inhibitor 206 is used to prevent arrival of the command to one of the left memory array 202 and the right memory array 204 based on the array inhibit command at 1308.

According to some embodiments, systems and method are provided for operating a multi-array memory that includes a left memory array and a right memory array of a memory bank. A command is received at memory input pins. A signal representative of the command is propagated to an array control inhibitor. An array inhibit command is received on one or more other pins of the memory and provided to the array control inhibitor. The array control inhibitor is used to prevent arrival of the command to one of the left memory array and/or the right memory array based on the array inhibit command.

In an embodiment, a memory circuit includes a left memory array of a memory bank comprising a plurality of left memory cells and a right memory array of the memory bank comprising a plurality of right memory cells. A plurality of command input pins are configured to receive a command. One or more array inhibiting pins are configured to receive an inhibit command to block command signals to one of the left memory array and right memory array. An array control inhibitor is configured to receive the inhibit command and to prevent arrival of the command to one of the left memory array and the right memory array based on the inhibit command.

In an additional embodiment, a memory circuit includes a left memory array of a memory bank powered by a left memory array power bus; a right memory array of the memory bank powered by a right memory array power bus; first control circuitry configured to operate the left memory array, the first control circuitry powered by a first control power bus; and second control circuitry configured to operate the right memory array, the second control circuitry powered by a second control power bus. A array control inhibitor circuit is configured to receive memory state control signals wherein the array control inhibitor circuit is configured to inhibit power buses according to a mode identified by the memory state control signals, said inhibiting including: inhibiting the left array power bus, the first control power bus, the right array power bus, and the second control power bus in a shutdown mode; inhibiting the first control power bus in a right array operation mode; and inhibiting the second control power bus in a left array operation mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a left memory array of a memory bank comprising a plurality of left memory cells;
a right memory array of the memory bank comprising a plurality of right memory cells; and
an array control inhibitor configured to receive an inhibit command and to prevent arrival of a command to memory arrays based on a mode identified by the inhibit command, said preventing comprising:
preventing arrival of the command to the left memory array in a right array operation mode; and
preventing arrival of the command to the right memory array in a left array operation mode.

2. The memory circuit of claim 1, further comprising a plurality of command input pins configured to receive the command, wherein:
the array control inhibitor is further configured to block propagation of the command from the command input pins to the left memory array when the inhibit command identifies a right array operation mode; and
the array control inhibitor is further configured to block propagation of the command from the command input pins to the right memory array when the inhibit command identifies a left array operation mode.

3. The memory circuit of claim 1, wherein:
a word line signal destined for the left memory array is blocked when the inhibit command indicates a right array operation mode; and
a word line signal destined for the right memory array is blocked when the inhibit command indicates a left array operation mode.

4. The memory circuit of claim 1, wherein the array control inhibitor includes a left array sub-circuit that includes one or more gates configured to receive a signal representing the command and a signal indicating whether the inhibit command identifies a left array operation mode.

5. The memory circuit of claim 4, wherein the array control inhibitor further includes a right array sub-circuit that includes one or more gates configured to receive a signal representing the command and a signal indicating whether the inhibit command identifies a right array operation mode.

6. The memory circuit of claim 1, wherein the inhibit command identifies whether the command is to be propagated to:
the left memory array but not the right memory array;
the right memory array but not the left memory array; or
both the left memory array and the right memory array.

7. The memory of claim 1, wherein the command comprises signals transmitted within the memory as two or more of: a word line signal, a read column signal, a data clock signal, a bit line pre-charge signal, a sense amplifier signal, and a sense amplifier pre-charge signal.

8. A memory circuit comprising:
a left memory array of a memory bank;
a right memory array of the memory bank;
first control circuitry configured to operate the left memory array, the first control circuitry powered by a first control power bus;
second control circuitry configured to operate the right memory array, the second control circuitry powered by a second control power bus; and
an array control inhibitor circuit configured to receive memory state control signals, wherein the array control inhibitor circuit is configured to inhibit power buses according to a mode identified by the memory state control signals, said inhibiting comprising:
inhibiting the first control power bus in a right array operation mode; and
inhibiting the second control power bus in a left array operation mode.

9. The memory circuit of claim 8, wherein the left memory array is powered by a left memory array power bus, the right memory array is powered by a right memory array power bus, and said inhibiting further comprises:

inhibiting the left memory array power bus, the first control power bus, the right memory array power bus, and the second control power bus in a shutdown mode; and inhibiting the first control power bus and the second control power bus in a sleep operation mode.

10. The memory circuit of claim 8, wherein the left memory array is powered by a left memory array power bus, the right memory array is powered by a right memory array power bus, and said inhibiting further comprises:

inhibiting the left memory array power bus in the right array operation mode; and inhibiting the right memory array power bus in the left array operation mode.

11. The memory circuit of claim 9, wherein the memory state control signals comprise: a shutdown signal, a sleep signal, a right array signal, and a left array signal.

12. The memory circuit of claim 11, wherein the array control inhibitor circuit comprises:

a left control subcircuit configured to inhibit the first control power bus based on receipt of any of: the shutdown signal, the sleep signal, and the right array signal; and a right control subcircuit configured to inhibit the second control power bus based on receipt of any of: the shutdown signal, the sleep signal, and the left array signal.

13. The memory circuit of claim 12, wherein the array control inhibitor circuit comprises:

a left array subcircuit configured to inhibit the left memory array power bus based on receipt of any of: the shutdown signal and the right array signal; and a right array subcircuit configured to inhibit the right memory array power bus based on receipt of any of: the shutdown signal and the left array signal.

14. The memory circuit of claim 8, wherein each power bus is controlled by transistors responsive to a power source node, wherein said inhibiting comprises turning off one or more of the transistors.

15. A method of operating a multi-array memory that includes a left memory array and a right memory array of a memory bank, comprising:

receiving a command;

receiving an array inhibit command; and using an array control inhibitor to prevent arrival of the command to memory arrays based on a mode identified by the array inhibit command, said preventing comprising:

preventing arrival of the command to the left memory array in a right array operation mode; and preventing arrival of the command to the right memory array in a left array operation mode.

16. The method of claim 15, wherein said preventing further comprises providing at least a portion of the command and at least a portion of the array inhibit command to an AND gate to block propagation of the at least portion of the command.

17. The method of claim 15, wherein said preventing further comprises disabling power to a buffer gate configured to forward the at least a portion of the command when powered and said disabling is based on the at least a portion of the array inhibit command.

18. The method of claim 15, wherein said preventing further comprises powering down local and global input/output portions of a memory associated with the left memory array or the right memory array based on the at least a portion of the array inhibit command.

19. The method of claim 18, further comprising powering down the left memory array or the right memory array based on the at least a portion of the array inhibit command.

20. The method of claim 19, further comprising:

powering down all local and global input/output portions of the memory based on a sleep command received on a first pin of the memory; and powering down all local and global input/output portions of the memory and the left and right memory arrays based on a shutdown command received on a second pin of the memory.

* * * * *